(12) United States Patent
Behel et al.

(10) Patent No.: US 6,861,903 B1
(45) Date of Patent: Mar. 1, 2005

(54) SIGNAL COUPLING SYSTEMS WITH ENHANCED ISOLATION AND DYNAMIC RANGE

(75) Inventors: John Kevin Behel, Greensboro, NC (US); Frank Murden, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 23 days.

(21) Appl. No.: 10/650,612

(22) Filed: Aug. 27, 2003

(51) Int. Cl.[7] .............................. H03F 1/30; H03F 3/68
(52) U.S. Cl. ........................... 330/144; 30/286; 30/295
(58) Field of Search ....................... 330/54, 98, 124 R, 330/144, 286, 295, 310, 311; 333/81 R

(56) References Cited

U.S. PATENT DOCUMENTS

| | | | |
|---|---|---|---|
| 4,521,764 A | 6/1985 | Burton | 340/347 |
| 5,021,743 A * | 6/1991 | Chu et al. | 330/286 |
| 5,077,541 A | 12/1991 | Gilbert | 339/284 |
| 5,532,637 A | 7/1996 | Khoury et al. | 327/359 |
| 5,859,559 A | 1/1999 | Hong et al. | 327/359 |
| 6,727,762 B1 * | 4/2004 | Kobayashi | 330/295 |

* cited by examiner

*Primary Examiner*—Khanh V. Nguyen
(74) *Attorney, Agent, or Firm*—Koppel. Jacobs, Patrick & Heybl

(57) ABSTRACT

Signal coupling systems are provided which enhance signal isolation and dynamic range with structures that increase bias voltages in upstream signal amplifiers to guard against transistor saturation that would otherwise increase current drain, reduce response time and possibly cause lock-up of an associated gain-control system. Dynamic range is thus enhanced because these systems can operate over an extended range of source signals. The increased bias voltages also decrease parasitic junction capacitances which increases input impedances and thereby enhances signal isolation and reduces signal distortion.

20 Claims, 3 Drawing Sheets

SIGNAL COUPLING SYSTEMS WITH ENHANCED ISOLATION AND DYNAMIC RANGE

BACKGROUND OF THE INVENTION

1. Field of the Invention

The present invention relates generally to gain-control structures stems and more particularly, to signal-coupling systems.

2. Description of the Related Art

Gain-control structures are particularly suited for use in feedback control loops that maintain substantially-constant signal amplitudes for a variety of electronic systems (e.g., wireless transceivers). In such use, a gain-control structure successfully reduces its gain in response to a large-amplitude source signal at its input. It has often been found, however, that the large signal amplitude disturbs junction biases in input transistors with consequent degradation of signal isolation and dynamic range.

BRIEF SUMMARY OF THE INVENTION

The present invention is directed to signal coupling systems which enhance signal isolation and dynamic range. These advantages are realized with structures that increase bias voltages to guard against transistor saturation, decrease parasitic junction capacitances and turn off unneeded amplifier structures.

The novel features of the invention are set forth with particularity in the appended claims. The invention will be best understood from the following description when read in conjunction with the accompanying drawings.

DETAILED DESCRIPTION OF THE INVENTION

Figure 1:
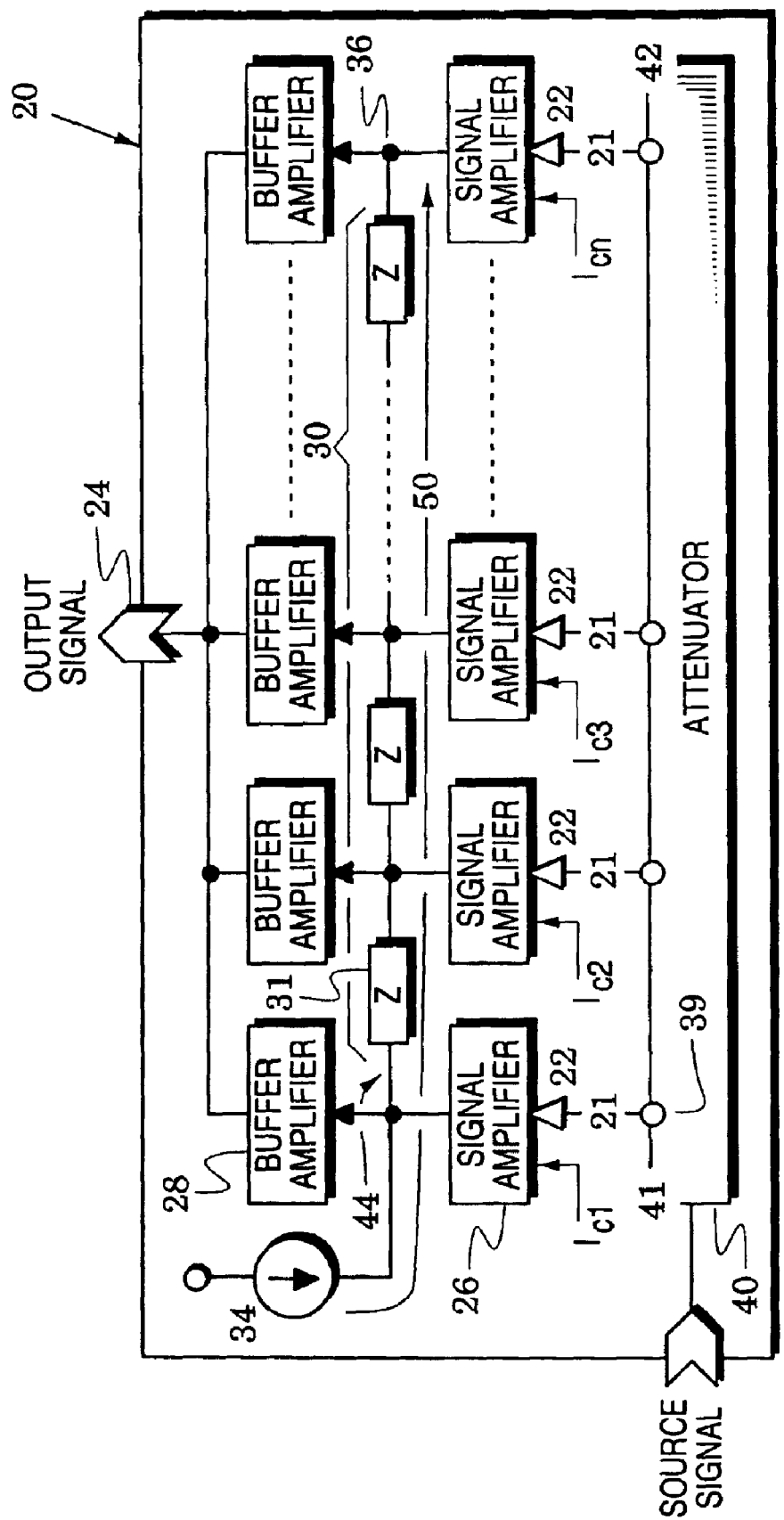
FIG. 1 is a block diagram of a signal coupling system embodiment of the present invention.
Figure 2:
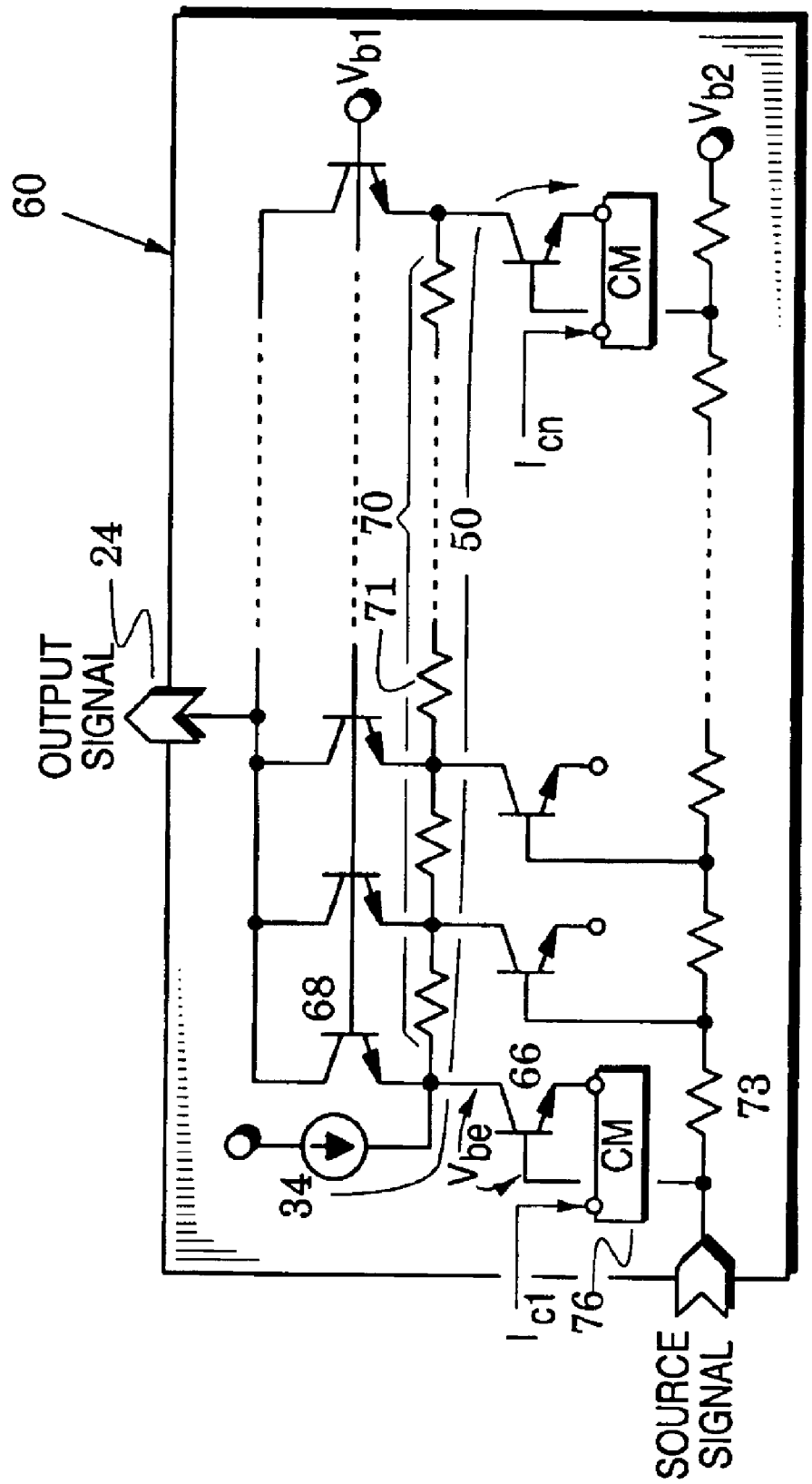
FIGS. 2 and 3 are schematic diagrams of other signal coupling system embodiments.
Figure 3:
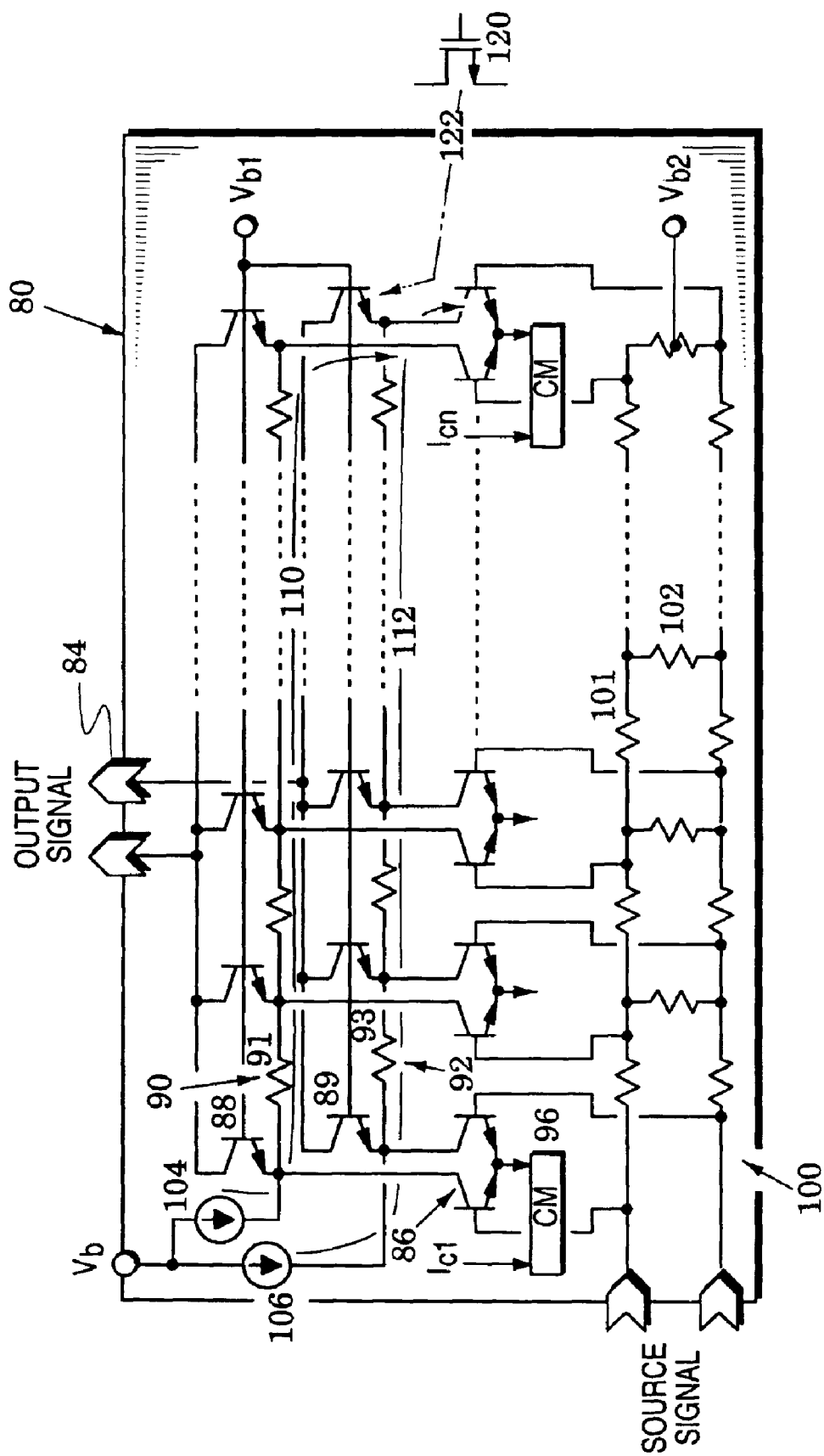

FIGS. 1–3 illustrate signal coupling system embodiments of the present invention that enhance the system's signal isolation and dynamic range.

In particular, FIG. 1 illustrates a coupling system 20 for coupling input signals 21 from a plurality of system input ports 22 to a system output port 24. The system includes a plurality of signal amplifiers 26, a plurality of buffer amplifiers 28, a string 30 of impedance elements 31 and a current source 34.

The signal amplifiers 26 are each coupled to a respective one of the system input ports 22 and the buffer amplifiers 28 are each inserted between a respective one of the signal amplifiers and the system output port 24. Interstage junctions 36 are thus defined between the buffer amplifiers 28 and their respective signal amplifiers 26 and the impedance elements 31 are each coupled between a respective pair of the interstage junctions 36.

The coupling system 20 is especially suited for use in a gain-control system in which the signal amplifiers 26 are activated by respective control signals $I_{c1}$, $I_{c2}$, - - - $I_{cn}$ and the input signals 21 are provided at taps 39 of a fixed attenuator 40 which receives a source signal at an upstream end 41 of the attenuator. As the source signal moves downstream through the attenuator 40, it is successively attenuated so that the amplitudes of the input signals 21 are least at the tap adjacent the downstream end 42 of the attenuator 40. With upstream and downstream directions thus established, it is noted that the current source 34 is coupled to the upstream end 44 of the string 30.

In a typical gain-control system application, the control signals $I_{c1}$, $I_{c2}$, - - - $I_{cn}$ are provided (e.g., by a feedback loop) to maintain a substantially-constant amplitude in the output signal 24 as the amplitude of the source signal varies from a minimum to a maximum amplitude. The source signal could be provided, for example, by an antenna or a radio-frequency amplifier stage in a signal receiver system. The output signal 24 would then be routed to other receiver elements, e.g., a signal mixer or an intermediate-frequency amplifier.

When the source signal is at minimum amplitude, a gain-control system would typically apply the control signal $I_{c1}$ so that its corresponding signal amplifier and buffer amplifier would process their corresponding input signal 21 which is the strongest input signal. This comprises a high-gain state in which the gain from the source signal to the output signal 24 is greatest.

In contrast, the gain-control system would typically apply the control signal $I_{cn}$ when the source signal is at a maximum amplitude so that this control signal's corresponding signal amplifier and buffer amplifier would then process their corresponding input signal 21 which is the weakest input signal. This comprises a low-gain state in which the gain from the source signal to the output signal 24 is least. AB the amplitude of the source signal successively progresses from a minimum to a maximum amplitude, the gain-control system would successively apply the control signals $I_{c1}$, $I_{c2}$ - - - $I_{cn}$ to successively step the gain from the high-gain state to the low-gain state.

FIG. 1 illustrates a case in which a gain-control system has applied the control signal $I_{cn}$ (in response to a strong source signal). The bias current 50 of the current source 34 then passes down the string 30 to the activated furthest-downstream signal amplifier 26. The resultant voltage drop across each of the impedance elements 31 generates successively-increasing bias voltages at the upstream signal amplifiers. As the amplitude of the source signal decreases and the gain is successively increased, the bias current 50 successively flows to signal amplifiers further upstream until it finally flows to the most-upstream signal amplifier.

The benefits of the bias current 50 and its generated bias voltages are more easily demonstrated with reference to the coupling system 60 of FIG. 2. This system also has an output port 24 but the signal amplifiers 26 and buffer amplifiers 28 of FIG. 1 are realized respectively as input transistors 66 and cascode transistors 68 that are arranged to form cascode amplifier stages in which the cascode transistors 68 receive a first bias voltage $V_{b1}$ on their bases. The string 30 of impedance elements 31 of FIG. 1 are realized as a string 70 of resistors 71 and the attenuator 40 of FIG. 1 is realized with a string of resistors 73 that receive a second bias signal $V_{b2}$ at their downstream end.

The control signals $I_{c1}$, $I_{c2}$ - - - $I_{cn}$ of FIG. 1 are realized as control currents which are applied via current mirrors (CM) 76 that are coupled to draw signal currents from the emitters of the input transistors 66 (for clarity of illustration, only the current mirrors associated with the furthest-upstream and furthest-downstream input transistors are shown).

Similar to the coupling system 20 of FIG. 1, the coupling system 60 also has a current source 34 and the system is shown in a low-gain state in which this source's bias current 50 flows to the furthest-downstream input transistor 66. This would be the result when a gain-control system had placed the elements of FIG. 2 in the low-gain state because the amplitude of the source signal had risen to its maximum value.

Accordingly, the furthest-downstream input transistor 66 is currently activated and the bias current 60 generates voltages across each of the string resistors 71 so that the collector voltages of the input transistors 66 successively rise to a maximum collector voltage at the furthest-upstream input transistor. Therefore, the collector bias voltages of the input transistors successively increase as the amplitude of the source signal at their bases successively increases.

In an important feature of the invention, the successively-increased collector bias voltages insure that the upstream input transistors 66 do not saturate in the presence of large-amplitude source signals which would otherwise significantly increase current drain, reduce response time and possibly cause lock-up of an associated gain-control system.

In another important feature of the invention, the increased collector bias voltages successively decrease the parasitic capacitance associated with the base-collector junctions of the upstream input transistors 66. Accordingly, the invention raises the impedances at the bases of the upstream input transistors 66 which inhibits leakage signals that might otherwise transit these transistors and reach the output port 24 to thereby degrade the system's operation. In addition, the higher base-collector impedances prevent distortions in the source signal that would otherwise reach the furthest-downstream input transistor 66 and also degrade the system's operation.

As noted above, the cascode transistors 68 all receive a first bias voltage $V_{b1}$ on their bases and the successively-rising collector voltages of the input transistors 66 thus inhibits turn on of the upstream cascode transistors. In simulations, it has been found that, generally, only immediately-adjacent cascode transistors will be turned on and their currents rapidly diminish in the upstream direction because of their successively decreasing base-emitter bias voltages.

In a high-gain state, a gain-control system would initiate the control signal $I_{c1}$ which would activate the furthest-upstream input transistor 66. Immediately-adjacent cascode transistors will generally turn on but because their emitter currents generate successively rising voltages along the string 70 of resistors 71, it has again been found that only immediately-adjacent cascode transistors will be turned on and their currents rapidly diminish in the downstream direction.

FIG. 3 illustrates a differential coupling system 80 for coupling differential input signals from a plurality of differential system input ports to a differential system output port 84.

In the differential system 80, the signal amplifiers 26 and buffer amplifiers 28 of FIG. 1 are respectively realized as differential pairs 86 of first and second transistors and as first and second cascode transistors 88 and 89 that are each arranged with a respective one of the first and second transistors of a differential pair to thus form cascode amplifier stages. The first and second cascode transistors 88 and 89 receive a first bias voltage $V_{b1}$ on their bases. In different embodiments of the invention, the differential pairs 86 can be realized as multi-tanh doublets or triplets.

The string 30 of impedance elements 31 of FIG. 1 are realized as a first string 90 of first resistors 91 that are associated with the first cascode transistors 88 and a second string 92 of second resistors 93 that are associated with the second cascode transistors 89.

The control signals $I_{c1}, I_{s2}$ - - - $I_{cn}$ of FIG. 1 are realized as control currents which are applied via current mirrors (CM) 96 that are coupled to provide tail currents for the differential pairs 86 (to enhance clarity of illustration, only the current mirrors associated with the furthest-upstream and furthest-downstream differential pairs are shown).

The attenuator 40 of FIG. 1 is realized as a ladder 100 formed with series and parallel resistors 101 and 102 to receive the differential source signal. Differential taps along the ladder 100 provide successively-attenuated versions of the differential source signal to the bases of the differential pairs 86 and a second bias signal $V_{b2}$ is applied at the ladder's downstream end to provide a bias for these bases.

The coupling system 80 has first and second current sources 104 and 106 that respectively provide bias currents 110 and 112. In a high-gain state, the furthest-downstream differential pair 86 would be activated by the control signal $I_{cn}$ and FIG. 3 illustrates that this would cause the bias currents 110 and 112 to flow through the resistor strings 90 and 92 to the furthest-downstream differential pair.

In response, the collector voltages of the other differential pair transistors successively rise to a maximum at the furthest-upstream differential pair. As gain is reduced, therefore, collector voltages of upstream differential pairs successively rise to protect them against saturation and to reduce their parasitic junction capacitances.

Signal coupling systems have been described which enhance signal isolation and dynamic range. These advantages are realized with structures that increase bias voltages in upstream signal amplifiers to guard against transistor saturation that would otherwise increase current drain, reduce response time and possibly cause lock-up of an associated gain-control system. Dynamic range is thus enhanced because these systems can operate over an extended range of source signals.

These structures also decrease parasitic junction capacitances which increases input impedances and thereby enhances signal isolation and reduces signal distortion. Buffer amplifiers are provided to enhance signal isolation which is further enhanced because the increasing upstream bias voltages turn off buffer amplifiers that are not currently required.

Simulations of the differential structures of FIG. 3 have demonstrated a substantially-linear gain response and a well-behaved phase response which makes these structures especially suited for use in gain-control systems.

Although embodiments of the invention have been described with reference to bipolar junction transistors, other embodiments are formed by substituting various other transistor structures, e.g., complementary metal-oxide-semiconductor (MOS) transistors. This substitution is exemplified in FIG. 3 where a MOS transistor 120 is substituted for a cascode transistor 89 as indicated by substitution arrow 122.

Useful coupling system embodiments may be formed with strings of equal-valued impedance elements (31 in FIG. 1, 71 in FIGS. 2 and 91 and 93 in FIG. 3) and also with strings of different-valued impedance elements. Although the impedance elements are resistors in FIGS. 2 and 3, they may be other devices, e.g., inductors, in other embodiments.

Current source 34 is coupled to an upstream end of the string 30 of impedance elements in FIG. 1 but, in general, the current source can be coupled in any manner that establishes bias signals along the string in response to activation of one of the signal amplifiers 26. The current amplitude and the magnitude of the impedance elements are preferably chosen so that the collector voltages of upstream signal amplifiers (e.g., 86 in FIG. 3) increase at least as much as the increase of the voltage of the source signal which appears at their bases.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A coupling system for coupling input signals from a plurality of system input ports to a system output port, comprising:
   a plurality of signal amplifiers each coupled to a respective one of said system input ports;
   a plurality of buffer amplifiers that are each inserted between a respective one of said signal amplifiers and said system output port, interstage junctions thus defined between said buffer amplifiers and their respective signal amplifiers;
   a string of impedance elements that are each coupled between a respective pair of said interstage junctions; and
   a current source coupled to provide a bias current through said string in response to activation of one of said signal amplifiers to thereby establish bias signals along said string.

2. The system of claim 1, wherein said impedance elements are resistors.

3. The system of claim 2, wherein each of said buffer amplifiers and its respective signal amplifier are arranged as a cascode amplifier stage.

4. The system of claim 1, wherein each of said signal and buffer amplifiers is realized with bipolar junction transistors.

5. The system of claim 1, wherein each of said signal and buffer amplifiers is realized with metal-oxide-semiconductor transistors.

6. The system of claim 1, wherein said signal amplifiers are differential pairs of transistors.

7. The system of claim 6, wherein each of said buffer amplifiers comprises a pair of transistors that are each arranged as a cascode amplifier stage with a respective one of the transistors of the respective differential pair.

8. The system of claim 7, wherein said buffer amplifiers and said signal amplifiers are formed with bipolar junction transistors.

9. The system of claim 7, wherein said buffer amplifiers and said signal amplifiers are formed with metal-oxide-semiconductor transistors.

10. The system of claim 7, further including an attenuator inserted to receive said input signals and provide successively-attenuated input signals to said system input ports.

11. The system of claim 10, wherein said attenuator is a resistive ladder.

12. A coupling system for coupling input signals to a system output port, comprising:
    an attenuator coupled to receive said input signals and provide successively-attenuated tap signals at a plurality of attenuator taps;
    a plurality of signal amplifiers each coupled to a respective one of said taps;
    a plurality of buffer amplifiers that are each inserted between a respective one of said signal amplifiers and said system output port, interstage junctions thus defined between said buffer amplifiers and their respective signal amplifiers;
    a string of impedance elements that are each coupled between a respective pair of said interstage junctions; and
    a current source coupled to provide a bias current through said string in response to activation of one of said signal amplifiers to thereby establish bias signals along said string.

13. The system of claim 12, wherein said attenuator is a resistive ladder.

14. The system of claim 12, wherein said signal amplifiers are differential pairs of transistors.

15. The system of claim 14, wherein each of said buffer amplifiers comprises a pair of transistors that are each arranged as a cascode amplifier stage with a respective one of the transistors of the respective differential pair.

16. The system of claim 12, wherein each of said buffer amplifiers and its respective signal amplifier are arranged as a cascode amplifier stage.

17. The system of claim 12, wherein said impedance elements are resistors.

18. A coupling system for coupling differential input signals from a plurality of differential system input ports to a differential system output port, comprising:
    a plurality of differential pairs of first and second transistors that are each coupled to a respective one of said differential system input ports;
    a plurality of first buffer amplifiers that are each inserted between a first transistor of a respective one of said differential pairs and a first side of said differential system output port, first interstage junctions thus defined between said first buffer amplifiers and their respective first transistors;
    a first string of impedance elements that are each coupled between a respective pair of said first interstage junctions;
    a first current source coupled to provide a first bias current through said first string in response to activation of one of said signal amplifiers to thereby establish first bias signals along said first string;
    a plurality of second buffer amplifiers that are each inserted between a second transistor of a respective one of said differential pairs and a second side of said differential system output port, second interstage junctions thus defined between said second buffer amplifiers and their respective second transistors;
    a second string of impedance elements that are each coupled between a respective pair of said second interstage junctions; and
    a second current source coupled to provide a second bias current through said second string in response to activation of one of said signal amplifiers to thereby establish second bias signals along said first string.

19. The system of claim 18, wherein said first and second buffer amplifiers each comprise a transistor arranged to form first and second cascode amplifier stages with their respective first and second transistors.

20. The system of claim 18, further including a resistive ladder inserted to receive said differential input signals and provide successively-attenuated differential input signals to said differential pairs.

* * * * *